(12) United States Patent
Yamamoto et al.

(10) Patent No.: US 9,245,778 B2
(45) Date of Patent: Jan. 26, 2016

(54) DIE BONDING APPARATUS, DIE PICKING UP APPARATUS AND DIE PICKING UP METHOD

(71) Applicant: Fastford Technology Co., Ltd., Minami-Alps, Yamanashi (JP)

(72) Inventors: Keita Yamamoto, Kumagaya (JP); Naoki Okamoto, Kumagaya (JP)

(73) Assignee: Fasford Technology Co., Ltd., Minami-Alps (JP)

( * ) Notice: Subject to any disclaimer, the term of this patent is extended or adjusted under 35 U.S.C. 154(b) by 236 days.

(21) Appl. No.: 13/779,934

(22) Filed: Feb. 28, 2013

(65) Prior Publication Data

US 2014/0060751 A1  Mar. 6, 2014

(30) Foreign Application Priority Data

Aug. 29, 2012 (JP) ................................ 2012-188339

(51) Int. Cl.
B32B 38/10 (2006.01)
H01L 21/67 (2006.01)

(52) U.S. Cl.
CPC .... *H01L 21/67121* (2013.01); *H01L 21/67132* (2013.01); *H01L 2221/68381* (2013.01); *Y10S 156/932* (2013.01); *Y10S 156/943* (2013.01); *Y10T 156/1132* (2015.01); *Y10T 156/1179* (2015.01); *Y10T 156/1744* (2015.01); *Y10T 156/1944* (2015.01); *Y10T 156/1983* (2015.01)

(58) Field of Classification Search
CPC ............... H01L 2221/68381; Y10T 156/1132; Y10T 156/1179; Y10T 156/1944; Y10T 156/1983; Y10S 156/932; Y10S 156/943
See application file for complete search history.

(56) References Cited

U.S. PATENT DOCUMENTS

2009/0242124 A1* 10/2009 Konno et al. ................ 156/344
2009/0279995 A1* 11/2009 Haji et al. ................. 414/752.1
2011/0308738 A1  12/2011 Maki et al.

FOREIGN PATENT DOCUMENTS

JP  2012-4393 A  1/2012

* cited by examiner

*Primary Examiner* — Mark A Osele
(74) *Attorney, Agent, or Firm* — Crowell & Moring LLP

(57) ABSTRACT

A die bonding apparatus includes a work supply/transfer portion for transferring a substrate; a bonding portion for conducting bonding of a die on the substrate; a wafer supply portion for supplying a wafer having the die thereon; and a controller portion for controlling equipment, wherein the wafer supply portion has a push-up unit for pushing up a dicing tape from a lower part, for separating the die from the dicing tape, and the push-up unit has a suction opening portion, which is configured to suck the dicing tape with vacuum, a push-up portion, which is made of an elastic body, sealing a fluid or a power therein, and is configured to push up the dicing tape, a cylinder, which is configured to apply pressure to the push-up portion, and an air supply means for supplying an air for changing the pressure within the cylinder through control of the controller portion.

5 Claims, 4 Drawing Sheets

DIE BONDING APPARATUS, DIE PICKING UP APPARATUS AND DIE PICKING UP METHOD

BACKGROUND OF THE INVENTION

The present invention relates to a die bonding apparatus for mounting a die (i.e., a semiconductor chip) on a substrate, and in particular, relates to a die picking up apparatus and die picking up method for picking up the die.

In general, in a die bonding apparatus for mounting a semiconductor chip, being called a "die", on the surface of a printed-circuit board or a lead frame, etc., (hereinafter, being called a "substrate", collectedly), for example; is conducted an operation (or, a job), repetitively; i.e., normally, transferring the die onto the substrate, by using a suction nozzle, such as, a collet, etc., to be applied with suppressing force thereon and heating on a bonding material thereof, thereby conducting the bonding.

Among die bonding processes by means of the die bonding apparatus, there is a separating process for separating a divided die from a wafer. In this separating process, the die is separated, one by one, from a dicing tape, which is held on a die picking up apparatus, being pushed up from the reverse surface of the dicing tape by a push-up unit, and is transferred onto a substrate by using a suction nozzle (i.e., a suction tool), such as, a collet, etc.

For example, in the following Patent Document 1, when separating a die, i.e., a target of separation, among plural numbers of dies attached on the dicing tape, by pushing it up, a separation starting point is formed by pushing up the dicing tape at a predetermined portion among the peripheral portions of the die, and thereafter, the die is separated from the dicing tape by pushing up the other portions than that predetermined portion.

PRIOR ART DOCUMENTS

Patent Documents

[Patent Document 1] Japanese Patent Laying-Open No. 2012-4393 (2012).

BRIEF SUMMARY OF THE INVENTION

However, in recent years, for the purpose of promoting a high-density amount of a semiconductor device, a thin-sizing of a package is advanced. In particular, a lamination package is put into a practical use, i.e., mounting plural pieces of dies on a printed-circuit board of a memory card in a 3D manner. When assembling such lamination package, for preventing thickness of the package from being increased, it is demanded to thin the thickness of the die down to 10 μm, approximately.

However, conventionally, the push-up unit is made from a solid of metal. For example, an initial push-up unit has a sharp-pointed needle of a solid, such as, a metal, in many cases, in particular, at a tip portion of the push-up unit, to be contact with the die, so that it can push up the die by breaking through the dicing tape. And, for lessening damages on the die, plural numbers of needles are provided, at the tip portion thereof, and in recent years, the tip portion comes to be plural numbers of turbinate parts, and further it pushes the die, gradually; thereby lessening the damage of the die.

For example, as is shown in the Patent Document 1, in case of separating the die from the dicing tape by pushing up the dicing tape, because of the pushing up by the solid body, the pushing up is made on the dicing tape at the predetermined portion among the peripheral portions of the die, so as to form the separation starting point, when pushing up the die, the target of separation, among plural numbers of dies attached on the dicing tape, thereby to separate it from the dicing tape, and thereafter, the die is separated from the dicing tape by pushing up the other portions than that predetermined portion.

With such the push-up unit as was mentioned above, since it pushes up the die by a solid structure, there is a possibility that a constrained force is applied on the die, depending on the conditions, such as, thickness of the die, the size (i.e., a chip size: a size of the die), bonding strength between the dicing tape and the die, etc. As a result of this, the pushing up operation results to generate damage (i.e., dropout, breaking, etc.) on the die.

An object of the present invention, by taking such drawbacks as mentioned above into the consideration thereof, is to provide a die picking up method for lessening the damage on the die, and also a high-reliable die bonding apparatus, for enabling the die bonding with certainty.

For accomplishing the object mentioned above, according to the present invention, there is provided a die bonding apparatus, comprising: a work supply/transfer portion, which is configured to transfer a substrate; a bonding portion, which is configured to conduct bonging of a die on said substrate transferred; a wafer supply portion, which is configured to supply a wafer having said die thereon; and a controller portion, which is configured to control each equipment, wherein said wafer supply portion has a push-up unit, which is configured to push up a dicing tape from a lower part, for separating said die from the dicing tape, and said push-up unit has a suction opening portion, which is configured to suck said dicing tape with vacuum, a push-up portion, which is made of an elastic body, sealing a fluid or a power therein, and is configured to push up said dicing tape, a cylinder, which is configured to apply pressure to said push-up portion, and an air supply means for supplying an air for changing the pressure within the cylinder through control of said controller portion.

According to the present invention, in the die bonding apparatus, as described in the above, it is preferable that said push-up portion is provided in an inside of said cylinder, and said elastic body deforms depending on the pressure of said cylinder; thereby separating said die from said dicing tape.

Further for accomplishing the object mentioned above, according to the present invention, there is also provided a die picking up apparatus, comprising: a vacuum chamber of a predetermined degree of vacuum; a suction opening portion having plural numbers of suction openings to be connected with said vacuum changer, for sucking a dicing tape through vacuum; a push-up portion, which is made of an elastic body sealing a fluid or a powder therein, and is configured to push up said dicing tape from below; a cylinder, which is configured to apply pressure to said push-up portion; and an air supply means for supplying an air for changing the pressure within said cylinder.

According to the present invention, in the die picking up apparatus, as described in the above, it is preferable that said push-up portion is provided in an inside of said cylinder, and said elastic body deforms depending on the pressure of said cylinder, and the deformation separates said die from said dicing tape.

Further for accomplishing the object mentioned above, according to the present invention, there is also provided a die picking up method, in an apparatus having a push-up unit, having: a vacuum chamber of a predetermined degree of vacuum; a suction opening portion having plural numbers of suction openings to be connected with said vacuum changer, for sucking a dicing tape through vacuum; a push-up portion, which is made of an elastic body sealing a fluid or a powder therein, and is configured to push up said dicing tape from below; a cylinder, which is configured to apply pressure to said push-up portion; and an air supply means for supplying an air for changing the pressure within said cylinder, comprising the following steps of: positioning a center of said push-up portion and a suction nozzle at a center of a die on a wafer, which is attached on said dicing tape and is to be picked up; rising up said push-up unit, so as to contact an upper surface of said suction opening portion closely onto said dicing tap, through said plural numbers of suction openings; increasing pressure of an air within said cylinder, so as to push an upper surface of said push-up portion within said cylinder upward; lowering the pressure of the air within said cylinder, so as to dent the upper surface of said push-up portion; and separating said die from said dicing tape.

According to the present invention, it is possible to accomplish a die picking up apparatus and a die picking up method for lessening the damage on the die, and also a high-reliable die bonding apparatus for enabling the die bonding with certainty. Also, because of less damage on the die, it is possible to achieve reduction of a production cost.

BRIEF DESCRIPTION OF THE SEVERAL VIEWS OF THE DRAWING

Those and other objects, features and advantages of the present invention will become more readily apparent from the following detailed description when taken in conjunction with the accompanying drawings wherein.

DETAILED DESCRIPTION OF THE PREFERRED EMBODIMENTS

Figure 1:
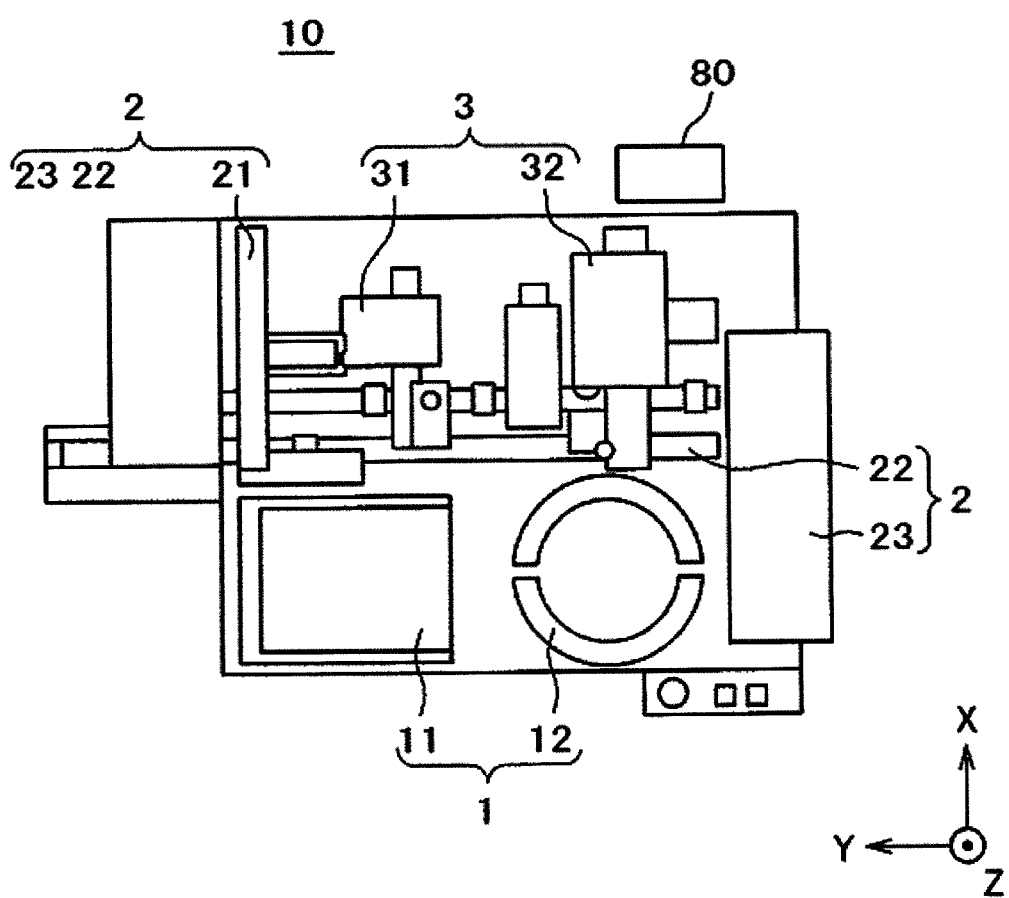
FIG. 1 is an overlook view for showing a die bonding apparatus, according to an embodiment of the present invention, seeing it from above.

Hereinafter, explanation will be made on an embodiment(s) according to the present invention, by referring to the attached drawings, etc.

However, the explanation, which will be give below, is for explaining an embodiment according the present invention, but not for limiting an extent of the invention of the present application. Accordingly, for the person skilled in the art, it is possible to adopt embodiments, replacing each of or all of those elements by equivalents thereof, and those embodiments are included in the extent of the invention of the present application.

Also, in this specification, in each explanation of each drawing, the same reference numerals are attached to the constituent elements, having common functions thereof, and the explanation thereof will be omitted.

FIG. 1 is an overlook view for showing a die bonding apparatus 10, according to an embodiment of the present invention, seeing it from above. The die bonding apparatus 10 has a wafer supply portion 1, a work supply/transfer portion 2 and a die bonding portion 3, roughly.

The work supply/transfer portion 2 has a stuck loader 21, a frame feeder 22 and a un-loader 23. A work, being supplied to the frame feeder 22 by the stuck loader 21, is transferred to the un-loader 23, through two (2) processing positions on the frame feeder 22. However, normally, the work is made up with plural numbers of substrates, and is separated into each substrate in the vicinity of a final process of production.

The die bonding portion 3 has a pre-form portion 31, and a bonding head portion 32. The pre-form portion 31 applies an adhesive (e.g., a bonding material) on the work, which is transferred by the frame feeder 22.

The bonding head portion 32 goes up, after picking up the die from the die picking up apparatus 12, and moves the die in the horizontal direction, up to a bonding point on the frame feeder 22. Thereafter, the bonding head portion 32 lowers the die, thereby bonding on the work. On which the die adhesive is applied.

The wafer supply portion 1 has a wafer cassette lifter 11 and the die picking up apparatus 12. The wafer cassette lifter 11 has a wafer cassette (not shown in the figure), being filled up with wafer rings therein, and supplies the wafer ring, one by one, to the die picking up apparatus 12.

Further, a controller portion 80 controls the operation of the die bonding apparatus 10, by accessing to each of the equipments, which build up the die bonding apparatus 10, mutually.

Figure 2:
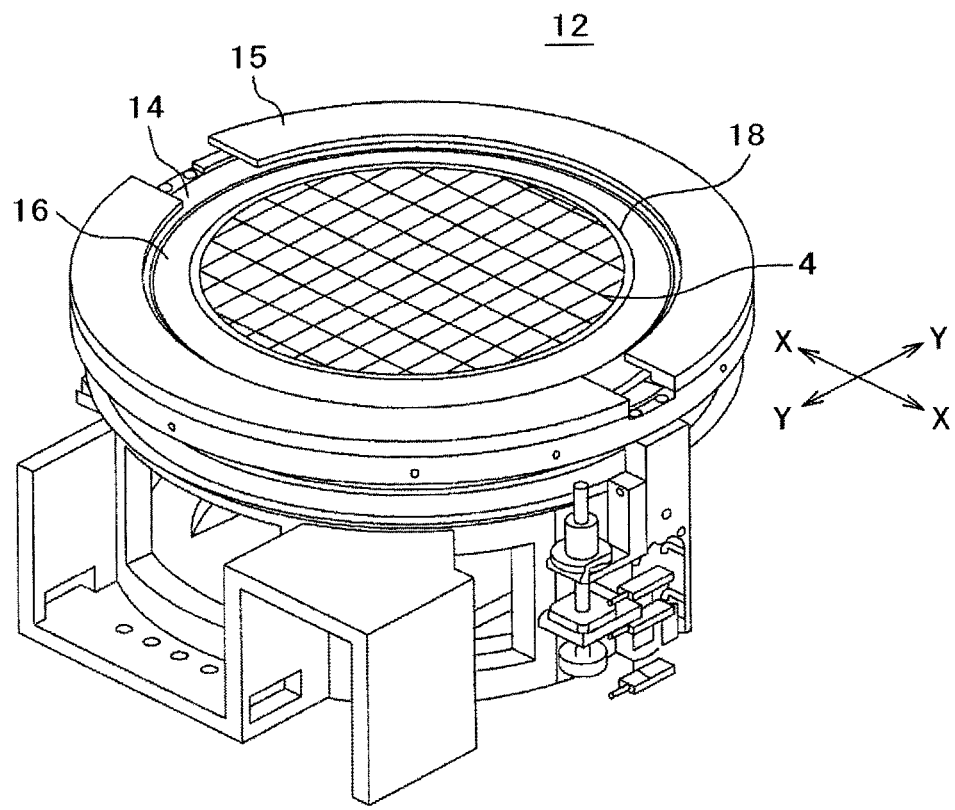
FIG. 2 is an outlook perspective view of the die bonding apparatus according to the embodiment of the present invention.
Figure 3:
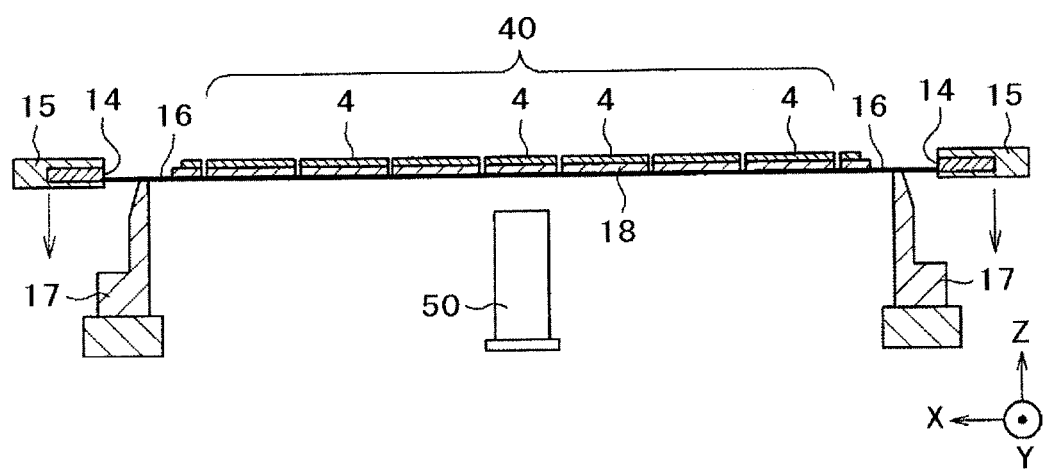
FIG. 3 is an outline cross-section view for showing principle portions of the die bonding apparatus according to the embodiment of the present invention.

Next, explanation will be given on the structure of the die picking up apparatus 12, by referring to FIGS. 2 and 3. This FIG. 2 is an outlook perspective view of the die bonding apparatus according to the embodiment of the present invention. Also, FIG. 3 is an outline cross-section view for showing principle portions of the die bonding apparatus according to the embodiment of the present invention. As is shown in FIGS. 2 and 3, the die picking up apparatus 12 has expand rings 15, for holding a wafer ring 14 thereon, a support ring 17, for positioning a dicing tape 16 held on the wafer ring 14, on which plural numbers of dies (i.e., the chips) 4 are attached, to be in the horizontal direction, and a push-up unit 50, for pushing up the die 4 positioned inside the support ring 17 upwards. The push-up unit 50 is made movable in the up/down (i.e., the vertical) direction by a driving mechanism not shown in the figure, but in the horizontal direction, the die picking up apparatus is made movable.

The die picking up apparatus 12 lowers the expand rings 15, which support the wafer ring 14, when pushing up the die 4. As a result thereof, the dicing tape 16 held on the wafer ring 14 is expanded, so that distance between the dies is widen, and the die 4 is pushed up from a lower portion thereof by the push-up unit 50; thereby increasing a capacity of picking up the die 4. However, accompanying with thin-sizing, the adhesive changes from a liquid-like one to a film-like one, and between the wafer and the dicing tape 16 is attached the film-like adhesive, being called a "die attach film" 18. With the wafer having the die touch film 18 thereon, dicing is conducted upon the wafer and the die attach film 18. Accordingly, in the separation process, the wafer and the die attach film 18 are separated from the dicing tape 16. However, hereinafter, explanation will be given on the separating process, but neglecting the existence of the die attach film 18 therefrom.

Figure 4A:
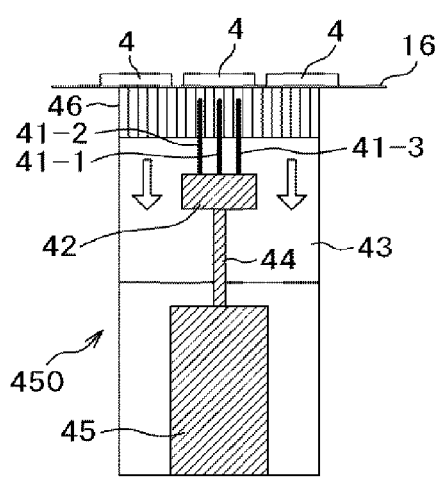
FIG. 4A is an outline cross-section view for explaining a conventional push-up unit in the die picking up apparatus.
Figure 4B:
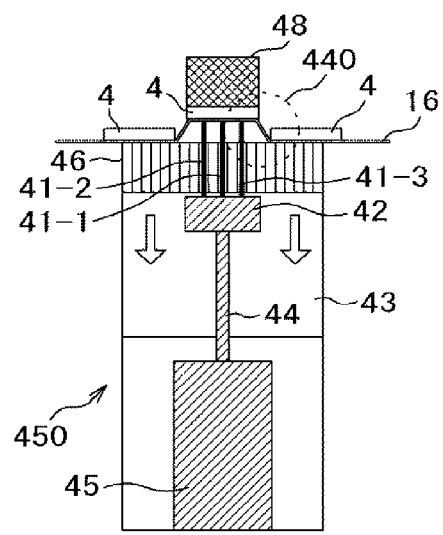
FIG. 4B is an outline cross-section view for explaining a conventional push-up unit in the die picking up apparatus.
Figure 4C:
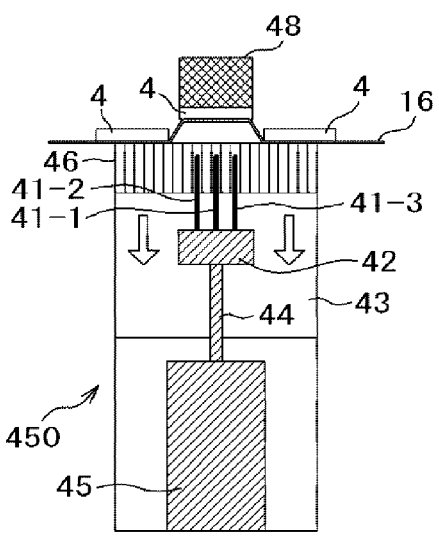
FIG. 4C is an outline cross-section view for explaining a conventional push-up unit in the die picking up apparatus.
Figure 4D:
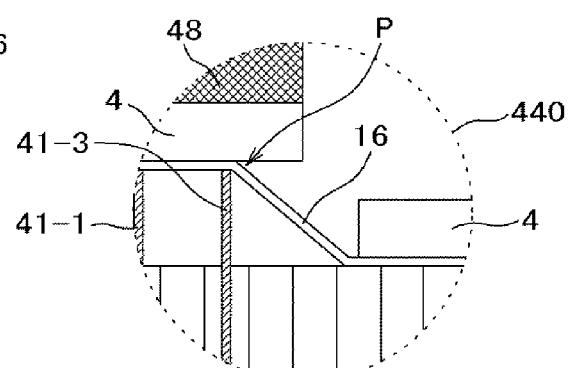
FIG. 4D is an enlarged view for showing a part of FIG. 4B.

First of all, explanation will be made on the conventional separating process, by referring to FIGS. 4A to 4D. Those FIGS. 4A to 4C are outline cross-section views for explaining the conventional push-up unit in the die picking up apparatus. Also, FIG. 4D is an enlarged view for showing a part of FIG. 4B. However, FIGS. 4A to 4C also show a part of the wafer, which is fixed on the expand rings 15. Furthermore, in those FIGS. 4A to 4D, a direction directing upward from the paper surface means an upper direction, while a direction directing downward the paper surface a lower direction.

The conventional separating process starts from, first of all, such condition as is shown in FIG. 4A. Thus, positioning is made at a center of a push-up unit 450 and a suction nozzle (please see the suction nozzle 48 shown in FIG. 4B), fitting to a center of the die 4 to be picked up, on the wafer, which is attached on the dicing tape 16. In this instance, what is moving in an XY (a plane) direction may be at least any one of the die 4, the push-up unit 450 and the suction nozzle.

After the positioning shown in FIG. 4A, the push-up unit 450 rises up, and an upper surface portion of a suction opening portion 46 of the push-up unit 450 is closely adhered on the dicing tape 16, due to vacuum from a vacuum chamber 43 of a predetermined degree of vacuum, through plural numbers of suction openings, which are provide in the suction opening portion 46.

Next, as is shown in FIG. 4B, depending on rising-up of a driving shaft 44 by a driving portion 45, a push-up block main body 42 goes up. Accompanying with the going-up of the push-up block main body 42, needles 41-1 to 41-3, which are provided on the push-up block main body 42, go up passing through the suction openings of the suction opening portion 46, and they push up the dicing tape 16 and the die 4 thereon.

In this instance, above the die 4 is the suction nozzle 48, and this sucks the die 4 into the upper direction. Also, the dicing tape 16 is sucked into the lower direction from the suction openings of the suction opening portion 46.

As a result of this, the dicing tape 16 and the die 4 are separated from, starting from a portion where the needles 41-1 to 41-3 push up.

FIG. 4D is a view of enlarging a part (i.e., a circle 44 of broken line) shown in FIG. 4B. As is apparent from FIG. 4D, the die 4 is separated, gradually, from the vicinity of a tip (shown by an arrow "P") of the needle 41-3, being in contact with the dicing tape 16.

And, in FIG. 4C, the dicing tape 16 and the die 4 are completely separated from, wherein the die 4 is sucked by the suction nozzle 48 to move to a predetermined bonding position; thereby the bonding is conducted thereon. Also, the push-up block main body 42 and the needles 41-1 to 41-3 of the push-up unit 450 are lowered down by the driving portion 45 and the driving shaft 44.

As is shown in FIGS. 4A through 4D, in the conventional separating process, because the push-up unit, for pushing up the dicing tape 16 and the die 4, directly, is made of the solid body, such as, the metal, etc., there is an anxiety that it gives damage on the die 4.

Figure 5A:
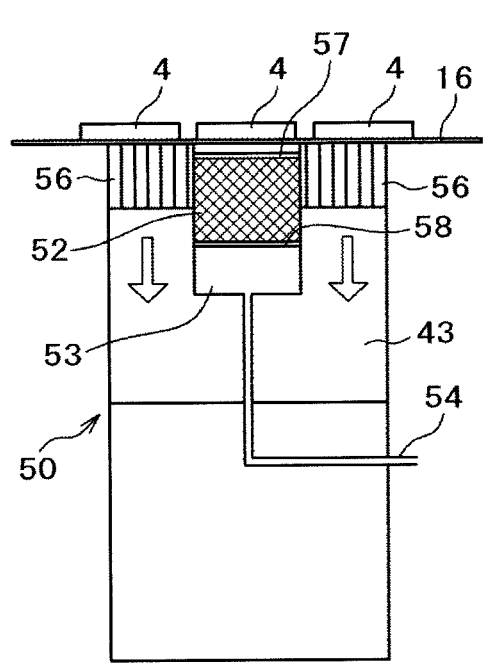
FIG. 5A is an outline cross-section view for explaining an example of a push-up unit in a die picking up apparatus of the die bonding apparatus according to the present invention.
Figure 5B:
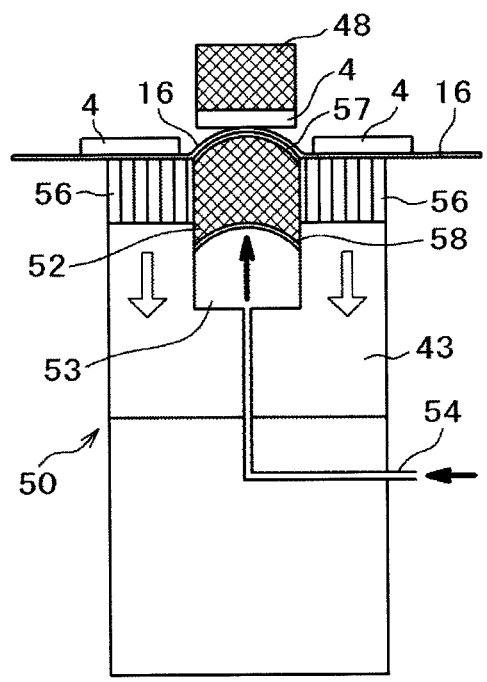
FIG. 5B is an outline cross-section view for explaining the example of the push-up unit in the die picking up apparatus of the die bonding apparatus according to the present invention.
Figure 5C:
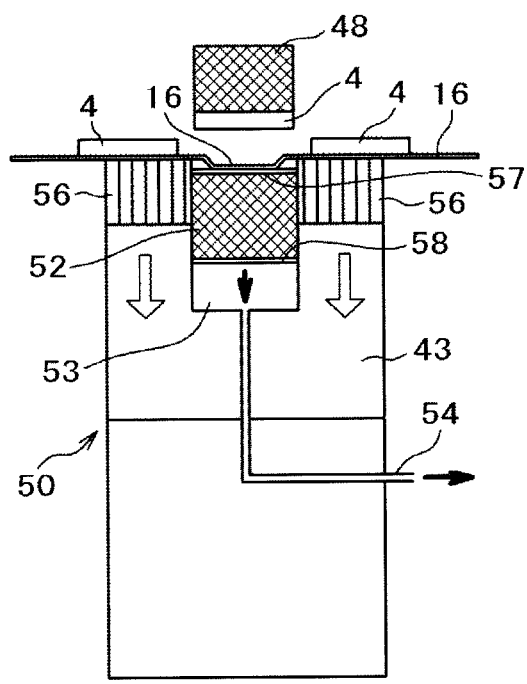
FIG. 5C is an outline cross-section view for explaining the example of the push-up unit in the die picking up apparatus of the die bonding apparatus according to the present invention.

Then, according to the present invention, such an improvement is made, as will be shown by FIGS. 5A to 5C.

By referring to FIGS. 5A to 5C, explanation will be given on an example of the die picking up method and the die bonding apparatus according to the present invention. FIGS. 5A to 5C are outline cross-section views for explaining the push-up unit, according to the present invention, in the die picking up apparatus. And, FIGS. 5A to 5C also show a part of the wafer fixed on the expand rings. Further, in those FIGS. 5A to 5C, a direction directing upward from the paper surface means an upper direction, while a direction directing downward the paper surface a lower direction.

The separating process according to the present invention starts, first of all, from such condition as is shown in FIG. 5A. Thus, positioning is made at a center of a push-up unit 50 (i.e., a push-up portion 52) and a suction nozzle (please see the suction nozzle 48 shown in FIG. 5B), fitting to a center of the die 4 to be picked up, on the wafer, which is attached on the dicing tape 16. In this instance, what is moving in an XY (a plane) direction may be at least any one of the die 4, the push-up unit 50 and the suction nozzle 48.

After the positioning shown in FIG. 5A, the push-up unit 50 rises up, and an upper surface portion of a suction opening portion 56 of the push-up unit 50 is closely adhered on the dicing tape 16, due to vacuum from a vacuum chamber 43 of a predetermined degree of vacuum, through plural numbers of suction openings, which are provide in the suction opening portion 46.

Next, as is shown in FIG. 5B, a high-pressure air is supplied to a cylinder 53 from a pump not shown in the figure, via a pipe 54. An amount of this air flow and pressure thereof are supplied in such a manner that it pushes a push-up portion 52 within the cylinder 53, upwards. However, this may not be the air, but may be other gas, such as, a nitrogen gas, etc., or may be a liquid for use of oil pressure, such as, an oil, etc.

As a result of this, an upper portion of the push-up portion 52 of the push-up unit 50 expands, and it pushes the dicing tape 16 and the die 14, upward.

In this instance, above the die 4 is the suction nozzle 48, and this sucks the die 4 into the upper direction. Also, the dicing tape 16 is sucked into the lower direction from the suction openings of the suction opening portion 56.

As a result of this, the dicing tape 16 and the die 4 are separated from, starting from an expansion of the push-up portion 52.

Next, as is shown in FIG. 5C, a pump not shown in the figure reduces pressure of the air, from the cylinder 53, via the pipe 54. In this manner, since the air within the cylinder 53 is reduced in the pressure thereof, the push-up portion 52 will turn back to the condition shown in FIG. 5A, or will be further drawn, downward, and thereby being dented downward.

In this manner, the pressure within the cylinder 53 is reduced, and the expansion of the push-up portion 52 is distinguished, then the dicing tape 16 on an upper side is withdrawn; thereby the die 4 and the dicing tape 16 are separated from (FIG. 5C).

Further, in FIG. 5C, the dicing tape 16 and the die 4 are separated from, completely, and the die 4 is sucked by the suction nozzle 48 to move to a predetermined bonding position; thereby the bonding is conducted thereon.

The push-up unit 50 according to the embodiment shown in FIGS. 5A to 5C applies therein a fluid, such as, the liquid, etc., comparing to the conventional push-up member, for pushing up the die 4 through the dicing tape 16 (for example, the needles 41-1 through 41-3 in FIGS. 4A through 4D), being the solid body. Thus, in the push-up unit 50 within the die picking up apparatus, according to the embodiment shown in FIGS. 5A to 5C, a push-up member (i.e., the push-up portion 52), for contacting on the dicing tape 16 to separate the die 4 therefrom, is an elastic body sealing a liquid therein. The push-up portion 52 has diaphragms 57 and 57, being disposed on a side of the dicing tape 16 and on a side of the pipe 54, respectively, and the liquid is sealed between those two (2) diaphragms 57 and 58. Also, in the cylinder 53 is sealed a gas. The cylinder portion as a whole is separated into an upper push-up portion 52 of a liquid chamber and a lower cylinder 53 of a gas chamber, via a lower surface diaphragm 58

Also, the cylinder 53 for pushing up the push-up portion 52 operates depending on change of the pressure and the flow amount of the air injected from the pipe 54. For example, when the high-pressure air is injected into the cylinder 53 so that the pressure within the cylinder 53 is increased, then a force to push upward is applied on the push-up portion 52, i.e., as the piston within the cylinder 53. The push-up portion 52, because the fluid in an inside thereof is sealed between the diaphragms 57 and 58, is pushed up from a lower part and it expands upward, bringing a central portion at a vertex thereof. Thus, depending on the pressure of the cylinder 53, a membrane of lower surface and a membrane of upper surface are deformed into an upper direction. Both of the membrane of lower surface and the membrane of upper surface, building up the push-up portion 52, are the diaphragm, and they expand/contract like a drum or an eardrum, depending on changes of the pressure.

Upward expansion of the membrane of upper surface (i.e., the diaphragm 57) of this push-up portion 52 pushes the dicing tape 16, upward. As a result of this, the die 4 attached on the dicing tape 16 is separated from the dicing tape 16.

In case where the fluid is a liquid or a powder, since the liquid or the powder is lower than the gas, in the compressibility thereof, it comes to be a buffer, and it is possible to control the diaphragm 57 of upper surface, in relatively easy.

Also, when the fluid is the gas, it is also possible to omit the diaphragm 58 of lower surface. In this case, for improving a responsibility, there is necessity of rising up the pressure of the gas to be applied higher than the atmospheric pressure. The reason of this is that, because the gas is a compressible fluid, it is difficult to control the diaphragm 57 on side of the dicing tape 16 into a predetermined shape. In other words, if the length of pipe comes to be long, then a ratio between a pipe volume and a volume of expansion of the diaphragm of lower surface comes to be large.

In case of the conventional push-up unit, because of pushing up by the solid body, such as, the needles, etc., distribution of pressure applied on the dicing tape and the die comes to be discontinuous, depending on a contacting condition. For this reason, damage (i.e., dropout, breaking, etc.) of the die can be easily generated due to a concentration of stress.

However, with the embodiment shown in FIGS. 5A to 5C, since the pressure is applied through the fluid, such as, the liquid, etc., when pushing up, the shape of a contact portion between the dicing tape 16, on which the dies 4 are attached, can change, freely. As a result of this, the distribution of pressure can be kept uniform, and constrained force is hardly applied on the die 4; therefore, the damage of the die 4 is hardly generated.

Further, conventionally, there is necessity of designing and manufacturing the push-up unit, being precisely machined, respectively, fitting to the size of the die; however, according to the present invention, because of contact of the fluid, it is not necessary to prepare the push-up unit, each time, fitting to the size of the die. And, further, if the size of the die is changed, since there is no necessity of replacing the push-up unit, it is possible to save the time necessary for replacement of arrangement when changing a machine model. However, a difference of the die can be treated with, by controlling the flow amount and the pressure of the air to be supplied to the cylinder, time-sequentially.

However, in the embodiment mentioned above, the fluid within the push-up portion 52 is water, for example. Also, it may be not the fluid, but may be the powder.

Further, in the embodiment mentioned above, the push-up portion and the cylinder are constructed to be one (1) body, respectively. However, they may be constructed to have plural numbers of cylinders, so that the same or plural numbers of high-pressure airs is/are injected into those, respectively. Also, they may be constructed to have plural number of the push-up portions within each of the cylinders.

The present invention may be embodied in other specific forms without departing from the spirit or essential feature or characteristics thereof. The present embodiment(s) is/are therefore to be considered in all respects as illustrative and not restrictive, the scope of the invention being indicated by the appended claims rather than by the forgoing description and range of equivalency of the claims are therefore to be embraces therein.

What is claimed is:

1. A die bonding apparatus, comprising:
   a work supply/transfer portion, which is configured to transfer a substrate;
   a bonding portion, which is configured to conduct bonding of a die on said substrate transferred;
   a wafer supply portion, which is configured to supply a wafer having said die thereon; and
   a controller portion, which is configured to control each equipment, wherein
   said wafer supply portion has a push-up unit, which is configured to push up a dicing tape from a lower part, for separating said die from the dicing tape, and
   said push-up unit has a suction opening portion, which is configured to suck said dicing tape with vacuum, a push-up portion, which is made of an elastic body, sealing a fluid or a powder therein, and is configured to push up said dicing tape, a cylinder, which is configured to apply pressure to said push-up portion, and an air supply means for supplying an air for changing the pressure within the cylinder through control of said controller portion,
   wherein said push-up portion has two diaphragms, which are disposed on a side of said dicing tape and on a side of said air supply means, respectively, and said fluid or said powder is sealed between the two diaphragms, and
   wherein said cylinder portion as a whole is separated into an upper push-up portion of a fluid or a powder chamber and a lower cylinder of a high-pressure air chamber via a lower surface diaphragm of the two diaphragms.

2. The die bonding apparatus, as described in the claim 1, wherein said push-up portion is provided in an inside of said cylinder, and said elastic body deforms depending on the pressure of said cylinder; thereby separating said die from said dicing tape.

3. A die picking up apparatus, comprising:
   a vacuum chamber of a predetermined degree of vacuum;
   a suction opening portion having plural numbers of suction openings to be connected with said vacuum changer, for sucking a dicing tape through vacuum;
   a push-up portion, which is made of an elastic body sealing a fluid or a powder therein, and is configured to push up said dicing tape from below;
   a cylinder, which is configured to apply pressure to said push-up portion; and an air supply means for supplying an air for changing the pressure within said cylinder, wherein said push-up portion has two diaphragms, which are disposed on a side of said dicing tape and on a side of said air supply means, respectively, and said fluid or said powder is sealed between the two diaphragms, and wherein said cylinder portion as a whole is separated into an upper push-up portion of a fluid or a powder chamber and a lower cylinder of a high-pressure air chamber via a lower surface diaphragm of the two diaphragms.

4. The die picking up apparatus, as described in the claim 3, wherein said push-up portion is provided in an inside of said cylinder, and said elastic body deforms depending on the pressure of said cylinder, and the deformation separates said die from said dicing tape.

5. A die picking up method, in an apparatus having a push-up unit, having: a vacuum chamber of a predetermined degree of vacuum; a suction opening portion having plural numbers of suction openings to be connected with said vacuum changer, for sucking a dicing tape through vacuum; a push-up portion, which is made of an elastic body sealing a fluid or a powder therein, and is configured to push up said dicing tape from below; a cylinder, which is configured to apply pressure to said push-up portion; and an air supply means for supplying an air for changing the pressure within said cylinder, comprising the following steps of:

positioning a center of said push-up portion and a suction nozzle at a center of a die on a wafer, which is attached on said dicing tape and is to be picked up;

rising up said push-up unit, so as to contact an upper surface of said suction opening portion closely onto said dicing tape, through said plural numbers of suction openings;

increasing pressure of an air within said cylinder, so as to push an upper surface of said push-up portion within said cylinder upward;

lowering the pressure of the air within said cylinder, so as to dent the upper surface of said push-up portion; and separating said die from said dicing tape, wherein said push-up portion has two diaphragms, which are disposed on a side of said dicing tape and on a side of said air supply means, respectively, and said fluid or said powder is sealed between the two diaphragms, and wherein said cylinder portion as a whole is separated into an upper push-up portion of a fluid or a powder chamber and a lower cylinder of a high-pressure air chamber via a lower surface diaphragm of the two diaphragms.

* * * * *